July 23, 1968

B. T. MURPHY 3,394,268

LOGIC SWITCHING CIRCUIT

Filed Feb. 1, 1965

3 Sheets-Sheet 1

INVENTOR
B. T. MURPHY
BY [signature]
ATTORNEY

LOGIC SWITCHING CIRCUIT

Filed Feb. 1, 1965 3 Sheets-Sheet 2

3,394,268
Patented July 23, 1968

3,394,268

LOGIC SWITCHING CIRCUIT

Bernard T. Murphy, New Providence, N.J., assignor to Bell Telephone Laboratories, Incorporated, New York, N.Y., a corporation of New York Filed Feb. 1, 1965, Ser. No. 429,345
12 Claims. (Cl. 307—215)

This invention relates to logic switching circuits and more particularly, to an improved diode transistor logic circuit suitable for incorporation in an integrated semiconductor device.

In diode transistor logic circuits, for example of the NAND or NOR configuration, enhanced switching speed may be attained by the provision of additional transistors and therefore higher gain. However, the provision of such additional gain generally has deleterious effects on circuit stability.

It is an object of this invention to improve the response of a logic switching circuit.

In particular, an object of this invention is a high speed logic switching circuit having low power gain when in the quiescent on condition.

A further object is a logic switching circuit which conveniently and economically is fabricated in monolithic or isolithic integrated form.

In one basic embodiment of this invention a logic switching circuit of the diode transistor type comprising an array of diode input gates, a transistor inverter output stage, a power input source and a diode level-shifting stage between input and output, further includes a transistor in the emitter-follower configuration and connected in parallel with said level-shifting stage and consequently between the input and output stages. Thus, two transistor stages provide high power gain during the turn-on transient to more fully realize the advantageous switching characteristics of transistors. Moreover, the circuit configuration in accordance with this invention is such as to provide a relatively low impedance path shunting both transistors when the circuit is fully on and conducting. Thus, the existence of a loop including the amplifying stages, which might give rise to oscillatory currents and consequent false switching, is avoided.

One advantage of this invention is that the inverter transistor may be kept out of the saturation condition by diode clamping in accordance with the prior art, thus enhancing the turn-off characteristic.

It is a further advantage that the turn-off characteristic is enhanced by the presence of the emitter-follower stage which enables use of a lower value of base bias resistor for the inverter transistor, thus enhancing turn-off by providing a lower impedance path for stored charge in the transistor. This configuration also facilitates the incorporation of this circuit in an integrated device inasmuch as the substitution of two low value resistors and the transistor of the emitter-follower for the relatively large resistor required in the basic type of DTL switching circuit requires at least no greater, and possibly a lesser, space requirement in the integrated block.

The invention and its other objects and features will be more clearly understood with the more detailed description in connection with the drawings.

Figure 1:
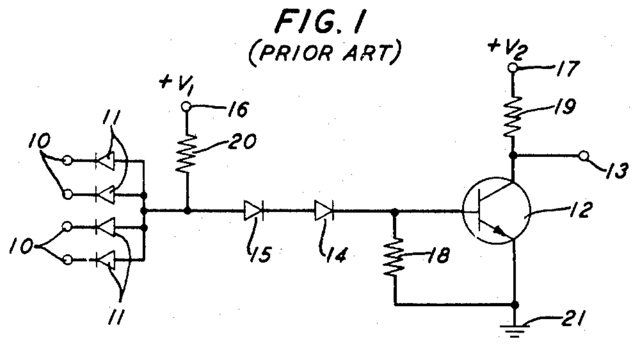
FIG. 1 (PRIOR ART)
FIG. 1 is a schematic circuit drawing of one form of conventional DTL circuit in accordance with the prior art.

Referring to FIG. 1 there is shown a conventional DTL circuit suitable for accomplishing the NAND function. Connected in parallel array are a plurality of diode gates 11, each connected to input terminals 10. The output stage comprises the transistor 12 and base-emitter resistor 18 in a conventional transistor inverter configuration. A source of positive voltage $V_1$ is provided at the terminal 16 and supplies the circuit through the control resistor 20. Conventional level-shifting diodes 14 and 15 are interposed between the input and output stages to alter the voltage level between stages. The operation of such a circuit is well known in the art and in the NAND form the circuit is off, with no output at terminal 13, so long as the voltages at all input terminals 10 are above the level of the voltage applied at terminal 16 less the drop across the resistor 20. Thus, with a low voltage at any of the input terminals 10 the corresponding gate diode 11 is forward-biased and will conduct. If on the other hand, the voltage at all of the input terminals 10 is high, all of the diode gates 11 are biased in reverse, i.e., the blocking condition; and a voltage is applied to forward bias diodes 15 and 14. Thus, current is supplied to the base of the transistor-inverter 12 thereby turning the transistor on. With the transistor 12 in the conducting state the voltage at the output terminal 13 is low, indicating that none of the input terminals 10 is on, thus expressing the NAND function. A positive voltage $V_2$ of lesser magnitude than that applied at terminal 16 is usually applied to terminal 17 in order to enhance the turn-on of the transistor 12.

Figure 2:
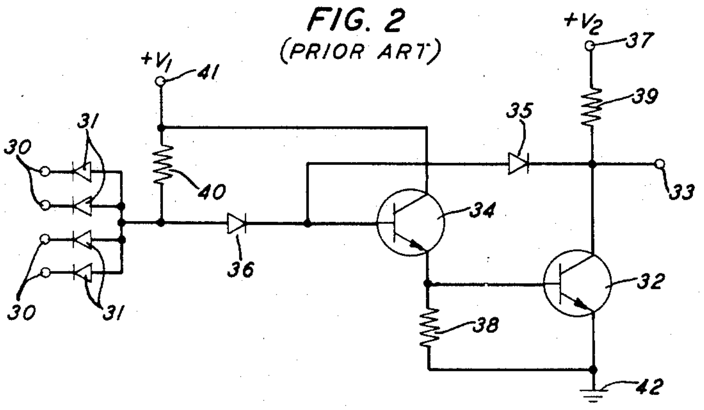
FIG. 2 (PRIOR ART)
FIG. 2 is a schematic circuit diagram of a DTL circuit in accordance with the prior art having an additional stage of transistor amplification.

Likewise, in accordance with the prior art, FIG. 2 illustrates the addition of another transistor stage in cascade to enhance the amplification during turn-on of the basic DTL configuration. This circuit is similar to that illustrated in FIG. 1 with the addition of transistor 34 in series with the level-shifting diode stage and, in particular, with the level-shifting diode 36. A diode clamp 35 is shown connected between the collector of the output transistor and the output of the level-shifting diode 36. As is known in the art this circuit serves to hold the voltage at the collector terminal at a level to inhibit saturation of the transistor thereby enhancing the turnoff characteristic, as well as limiting the current drawn by the transistor 34. This circuit although offering enhanced gain is unstable. In particular, spurious signals arising in the circuit can circulate during the ON state of the circuit through the transistor 34, transistor 32, returning through the collector circuit of this transistor and the clamping diode 35 to the base of transistor 34, thus giving rise to a loop capable of continued oscillation to the point where false switching can occur.

Figure 3:
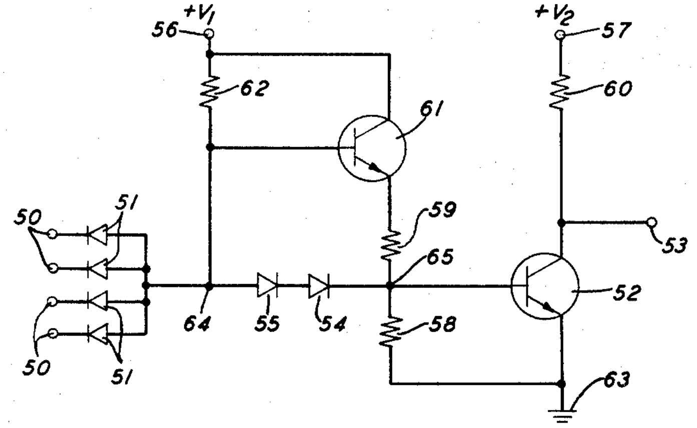
FIG. 3 is a schematic circuit diagram illustrating one embodiment of the invention herein.

In accordance with this invention, enhanced gain particularly during the turn-on is provided in a logic circuit, as illustrated in FIG. 3, by connecting in parallel relation with the level-shifting diodes 54 and 55, an emitter-follower stage represented by the transistor 61 and resistor 59. The configuration of the circuit of FIG. 3 is similar in other respects with the prior art circuit of FIG. 1.

In particular, emitter-follower transistor 61 has its collector connected to voltage supply terminal 56 and its base to the common input terminal 64. The emitter of transistor 61 is connected through resistor 59 to common terminal 65. Between the common terminals 64 and 65 are the pair of level-shifting diodes 54 and 55. The base of inverter transistor 52 is connected to the common terminal 65 while its emitter is connected to ground terminal 63. The resistor 58 is connected between common terminal 65 and the ground terminal 63. The collector of transistor 52 is connected through resistor 60 to a secondary voltage supply terminal 57 and directly to the output terminal 53.

However, in this embodiment of the invention, when the circuit turns on as a result of a high voltage at all of the input terminals, the power gain of both transistors is effective during the turn-on transient, thus enhancing the turn-on speed of the circuit. However, once the circuit has reached the ON condition, spurious voltages appearing at the base of transistor 61 find a low impedance path to ground through the level-shifting diodes 54 and 55, the saturated transistor 52 (2 or 3 ohms), or low value resistor 58 (500 ohms) to ground 63, thus the generation of oscillatory signals in an amplifying loop is avoided and circuit stability is increased.

Further, inasmuch as the emitter-follower transistor 61 insures an adequate voltage at the base input of inverter-transistor 52, the resistors 58 and 59 may be of comparatively low value. In particular, the resistor 58 can be of much lower value than the corresponding resistor 18 of the circuit of FIG. 1. As a consequence, the rapidity of turnoff of the transistor 52 is enhanced inasmuch as this lower impedance path enables a more rapid discharge of the stored charge in the base region of the transistor 52 through the resistor 58 to ground 63. Turnoff of the circuit occurs when the voltage at any input terminal 50 drops below the value required to maintain an adequate forward bias on the corresponding gate diode 51.

Figure 4:
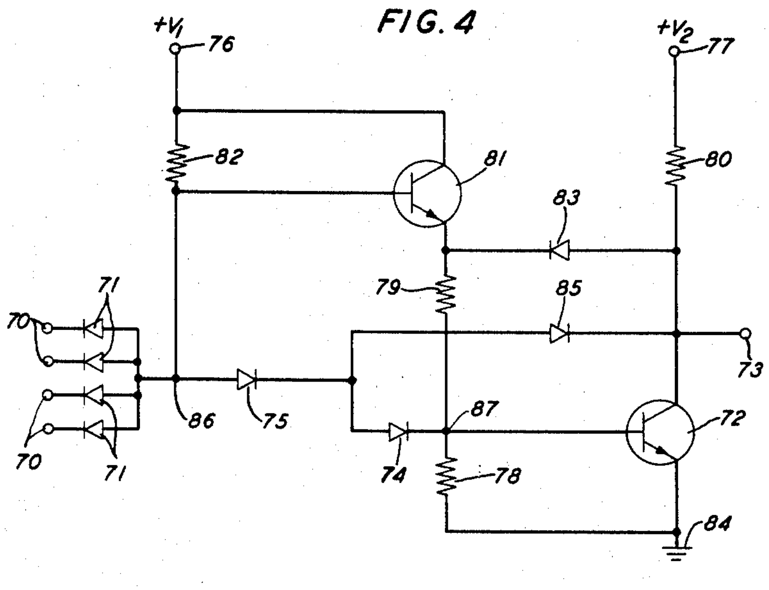
FIG. 4 is a further schematic circuit diagram illustrating another embodiment of the invention including diode clamps to enhance the switching response of the circuit.

Further improvement of the basic embodiment illustrated in FIG. 3 may be realized by the inclusion of the clamping diodes shown in the circuit arrangement of FIG. 4. In particular, saturation of the transistor 72 of the inverter stage may be inhibited by provision of the clamping diode 85 as previously indicated in connection with the circuit arrangement of FIG. 2.

In particular, clamping diode 85 is connected in the circuit between the collector connection of transistor 72 and terminal 87 by the level-shifting diodes 74 and 75. As in the case of the circuit of FIG. 3 there is a common input terminal 86 to which the base of emitter-follower transistor 81 is connected. Similarly, the emitter of emitter-follower transistor 81 is connected through resistor 79 to the common terminal 87. A further optional arrangement is the inclusion of a second clamping diode 83 connected between output terminal 73 and the emitter of transistor 81 and poled oppositely to clamping diode 85 for limiting the voltage excursion at the output terminal 73. As noted hereinafter this enables use of a common power supply for $V_1$ and $V_2$.

Typical values for the components of the circuit illustrated are as follows:

$V_1$—+5 volts
$V_2$—+3 volts
$V_2$—+5 volts (with clamping diode 83)
Input resistor 82—1500 ohms
Resistor 79 of the emitter-follower configuration—300 ohms
Base-emitter resistor 78—500 ohms.

The transistors are of NPN configuration, typically of the silicon planar structure and having an $f_t$ of about 1000 megacycles and desirably of low capacitance. Typically, the diodes employed for the gate and level-shifting functions are Western Electric Company units coded IN696, which are diffused junction silicon diodes. If the diode clamp 83 is not used, resistor 80 has a value of 300 ohms; but if the clamp 83 is included, resistor 80 is about 500 ohms.

Figure 5:
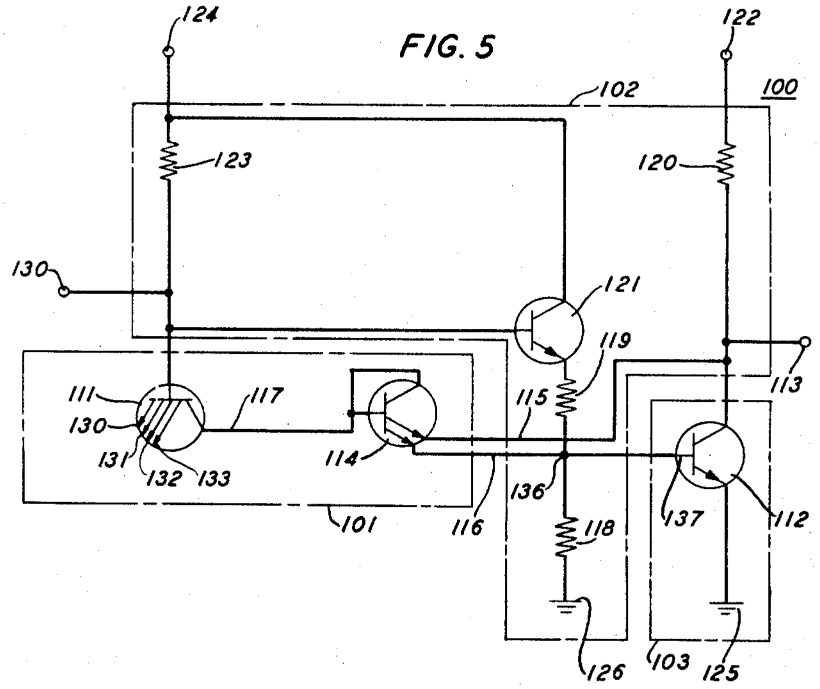
FIG. 5 is a schematic circuit diagram of the circuit configuration which is readily utilized in an integrated circuit embodiment of the invention.
Figure 6:
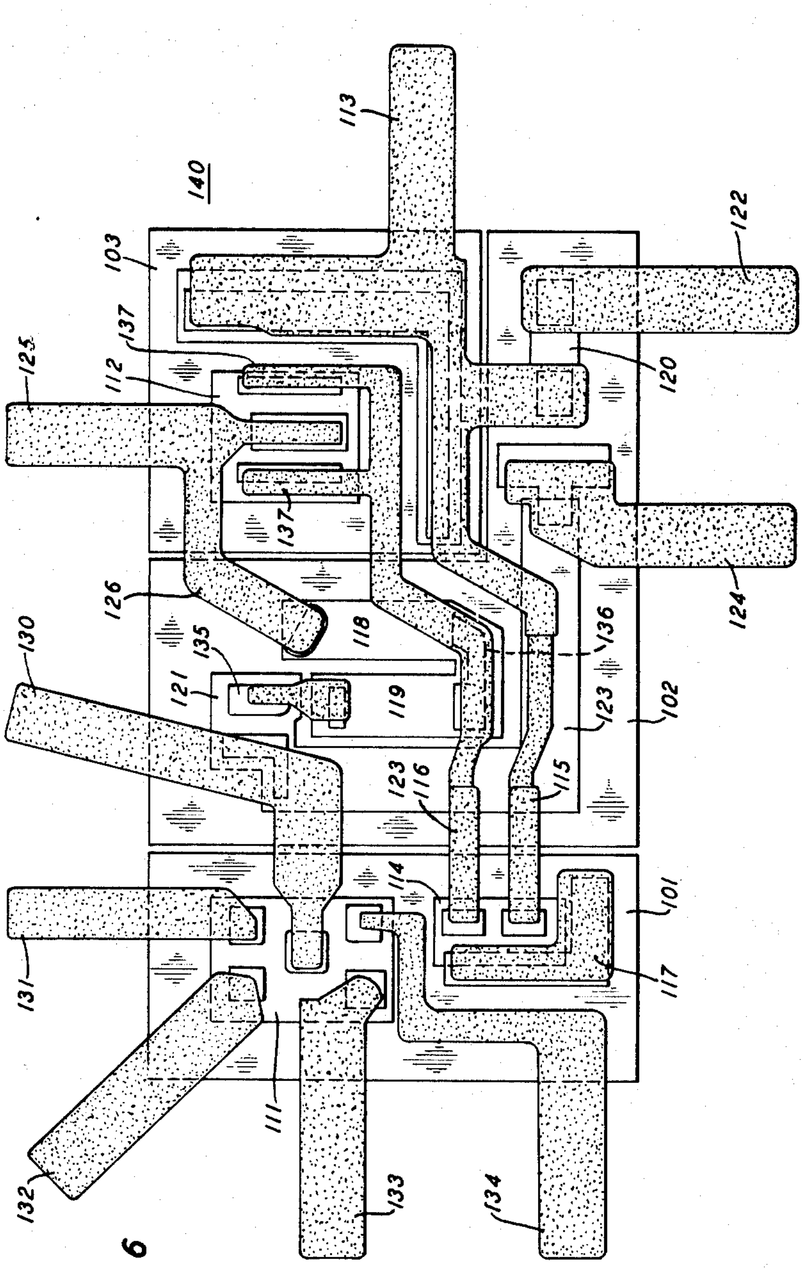
FIG. 6 is a plan view of the integrated semiconductor device incorporating the circuit configuration of FIG. 5.

FIG. 5 is a circuit arrangement in accordance with the invention which is particularly suitable for incorporation in integrated circuit form. The circuit of FIG. 5 is similar to that of FIG. 4, minus the diode clamp 83. In the circuit arrangement of FIG. 5 the input diode gates are represented in the form which they take in an integrated device generally referred to as a multiple emitter transistor 111. In this arrangement a series of separate emitter junctions are applied to a common base region within the semiconductor structure. This configuration is disclosed in my copending application, Ser. No. 423,694, filed Jan. 6, 1965. In this connection the collector junction connected at terminal 117 functions as the level-shifting diode 75 of FIG. 4. This is a conventional expedient with integrated structures for advantageously incorporating a plurality of elements in a small space. The level-shifter function performed by the collector junction could also be performed using an additional emitter junction on transistor 111 and shorting the collector-base junction. In the integrated circuit structure an additional terminal 130 typically is provided for ease of connection of further input gates, for example, from another integrated semiconductor device. The device shown as the multiple emitter transistor 114 functions as a pair of diodes in parallel. This transistor configuration is a conventional arrangement well known in the art for this purpose and is provided with a shorting connection between the base and collector, thus effectively eliminating the collector junction. As a circuit element one of the pair of emitters of transistor 114 is connected to the lead 116 and functions as the second level-shifting diode 74 of the circuit of FIG. 4. The other emitter junction connected to the lead 115 corresponds in function to the diode clamp 85 of circuit illustrated in FIG. 4. Both of the multiple emitter structures 111 and 114 are advantageous arrangements used in integrated semiconductor devices for reasons of convenience and economy. This will be more readily apparent with reference to the integrated device as it is illustrated in FIG. 6. In the arrangement shown in FIG. 5 portions of the circuit are outlined by broken lines to represent those portions which in the final integrated device will be completely isolated, one from another. Thus, the portion 101 comprises the input diode gates 130–134 and level-shifting and diode-clamping stages 117, 114. The portion 102 carries the voltage supply terminals 122 and 124 and emitter-follower stage 119–121 and base lead 136 to the inverter transistor 137, while portion 103 carries the inverter transistor 137 and ground connection 125.

Turning to FIG. 6, there is shown an integrated device 140 composed of the three portions 101, 102, and 103, illustrated in the circuit arrangement of FIG. 5. Insofar as possible, like reference numerals are used in FIG. 6 to correspond to similarly identified elements of FIG. 5. Thus, the isolated portions of the device of FIG. 6 are numbered 101, 102, and 103, respectively.

The device 140 is of the "beam-lead" type as disclosed in the U.S. patent to M. P. Lepselter, No. 3,335,338, granted Aug. 8, 1967. Thus the portions 101, 102, and 103 will be isolated one from another by a final etching process which leaves the three portions mechanically supported in the arrangement shown by the relatively heavy metal leads shown by the stippled areas in the figure. The integrated device is fabricated in accordance with well known techniques from a monolithic block of semiconductor material, typically silicon, by selected solid-state diffusion treatment to produce the base and emitter regions of the transistor configuration as well as the resistor strips which themselves are composed of diffused portions within the silicon block. After the deposition of electrodes and heavy metal "beam-leads" as disclosed in the above-noted application of Lepselter, the final masked etching step referred to above is carried out to produce a complete separation between the three portions 101, 102, and 103 and the resulting device structure supported integrally by the metal "beam-leads," is referred to as an "isolith."

At the left side of the device 140 is a portion 101 including the multiple emitter transistor 111 and the multiple emitter, shorted collector transistor 114. Centrally disposed in the integrated structure is an L-shaped member 102 including the emitter-follower transistor 121 and the resistors 118, 119, 123, and 120. The upper right corner portion 103 includes inverter-transistor 112 and connection to ground 125.

Referring more particularly to the circuit arrangement, the voltage input terminal 124 is connected both to the L-shaped resistor strip 123 and to the collector region of the emitter-follower transistor 121. As noted above, the resistors in this circuit arrangement are regions of controlled conductivity produced in the transistor body by selected solid-state diffusion of significant impurities. The lead 124 is connected by a low resistance contact not only to the one end of resistor 123 but also to the adjoining substrate which constitutes the collector region of the transistor 121. The base region of transistor 121 is a layer which is common to the other end of the resistor 123. Into this base layer there is diffused an emitter region 135 from which a metallic connection is taken to the one end of the resistor 119. Referring again to the terminal of the resistor 123 which is common to the base connection of base connector 121, there is also an external connection 130, as described above, for making further input gate connections conveniently. The lead 130 continues across to the portion 101 where it connects by way of an ohmic electrode to the base zone of multiple transistor 111.

The external leads 131, 132, 133, 134 comprise the diode inputs that are connected through diffused emitter regions to the base of transistor 111. As in the case of portion 102, the substrate of this portion 101 composes the collector region of this transistor. Connection is made from this collector terminal 117 to the shorted base-collector connection of multiple-emitter transistor 114 by the large L-shaped metallic contact on the transistor 114. The small rectangular areas on this transistor 114 represent the diffused emitters, the upper one of which, 116, connects through the terminal point 136 to the base electrode 137 of the transistor 112. The other emitter 115 comprises the clamping diode which is connected to the output terminal 113. Within the portion 102 can be seen the resistor portion 118, one end of which is connected to the ground connection 125, 126 which is an external lead on portion 103. This ground connection is also connected to the emitter of the inverter transistor 112. Finally, the other external connection 122 is connected to one terminal of the input resistor 120 which in turn is connected to the common point from which the output terminal 113 is taken.

From the foregoing description some appreciation may be gained of the degree of compactness and economy of material as well as fabrication which may be achieved by incorporation of circuits of this type into integrated semiconductor devices. In particular, the improved logic switching circuit of this invention lends itself to incorporation into such integrated devices.

Although the invention has been disclosed specifically in terms of a particular polarity orientation, it will be understood that similar logic functions may be accomplished using this general circuit configuration by reversing the polarities throughout the circuit including changing transistors to PNP types.

Moreover, it will be understood that the embodiments of the invention described are merely illustrative and that other arrangements may be devised by those skilled in the art which likewise will be within the scope and spirit of the invention.

What is claimed is:

1. A logic switching circuit comprising an input stage including a plurality of diode input gates and a voltage source terminal, an output stage comprising an inverter transistor, and an intermediate level-shifting stage between said input and output stages, characterized by an emitter-follower transistor stage connected in parallel relation to said level-shifting stage and between said input and output stages.

2. A logic switching circuit in accordance with claim 1 in which said level-shifting stage constitutes a lower impedance path to the lowest potential level in said circuit than the path through said emitter-follower stage.

3. In a logic switching circuit comprising an input stage including a plurality of diode input gates, a voltage source and an input stage resistor, an output stage comprising an inverter transistor, and an intermediate level-shifting stage interconnecting the input and output stages, the improvement comprising an emitter-follower transistor stage connected to include the input stage resistor in its collector-base circuit and the intermediate level-shifting stage in its emitter-base circuit.

4. A logic switching circuit comprising an input stage including a first voltage source and a plurality of diode input gates for controlling the application of said first voltage source, an output stage comprising an inverter transistor and an output terminal, and a level-shifting stage including at least one semiconductor diode connecting said input and output stages, characterized by an emitter-follower transistor stage connected in parallel relation to said level-shifting stage, said emitter-follower transistor having its collector connected to said voltage source, its base connected serially with said diode input gates and its emitter to the base of said inverter transistor by way of a resistance element, said level-shifting stage constituting a lower impedance path to ground than said emitter-follower stage.

5. A semiconductor logic switching circuit comprising an input stage, an output stage, and an intermediate stage connecting said input and output stages, said input stage including a voltage source and gate means responsive to input signals for controlling the application of voltage from said voltage source to said intermediate stage, said output stage including a transistor in inverter configuration and an output terminal, said intermediate stage comprising first circuit means for shifting the voltage level between input and output stages and second circuit means in parallel with said first circuit means for providing amplification between said input and output stages, said first circuit means constituting a lower impedance path than said second circuit means.

6. A semiconductor logic switching circuit in accordance with claim 5 in which said gate means of said input stage comprise a plurality of semiconductor diodes in parallel array.

7. A semiconductor logic switching circuit in accordance with claim 5 in which said first circuit means of said intermediate stage comprises at least one level-shifting semiconductor diode.

8. A semiconductor logic switching circuit in accordance with claim 5 in which said second circuit means of said intermediate stage comprises a transistor connected in the emitter-follower configuration.

9. A semiconductor logic switching circuit of the DTL type comprising an input terminal, a voltage connected to said input terminal, a plurality of input signal gates in parallel array connected to said input terminal, an output terminal, an output transistor having an emitter, a collector, and a base, said collector being connected to said output terminal and said emitter being connected to ground potential, first circuit means connecting said input terminal and the base of said output transistor, said first circuit means including at least one level-shifting diode, second circuit means including an emitter-follower transistor having an emitter, base and collector, the base of said emitter-follower transistor being connected to said input terminal, the collector of said emitter-follower transistor being connected to said voltage source, the emitter of said emitter-follower transistor being connected to the base of said output transistor by way of a resistance element, third circuit means including a resistive element between the base of said output transistor and ground potential, said first circuit means constituting a lower impedance path than said second circuit means.

10. A logic switching circuit comprising a plurality of input signal terminals and an input voltage supply terminal, a plurality of input diode gates each connected separately between an input signal terminal and a common point, a control resistor connected between the input voltage supply terminal and the common point, and an inverter transistor connected in grounded emitter configuration with an output terminal connected to its collector and a resistor connected to its emitter-base circuit, voltage level-shifting means connected between the common point and the base of said inverter transistor, and an emitter-follower transistor connected to include the control resistor in its collector-base circuit and the voltage level-shifting means in its emitter-base circuit.

11. The logic switching circuit in accordance with claim 10 further characterized in that diode clamping means are connected between the output terminal and the base of the inverter transistor.

12. The logic switching circuit in accordance with claim 10 characterized in that said circuit is incorporated in an integrated configuration comprising not more than three monolithic blocks of semiconductor material.

References Cited

UNITED STATES PATENTS

| | | | |
|---|---|---|---|
| 3,217,181 | 11/1965 | Zuk | 307—215 |
| 3,287,577 | 11/1966 | Hung et al. | 307—215 |

ARTHUR GAUSS, *Primary Examiner.*

R. H. PLOTKIN, *Assistant Examiner.*